United States Patent
Jiang et al.

(10) Patent No.: US 9,939,100 B2
(45) Date of Patent: *Apr. 10, 2018

(54) QUICK-RELEASE MOUNTING SYSTEM FOR REMOVABLY ATTACHING A COMPONENT TO A STRUCTURE

(71) Applicant: PANASONIC AVIONICS CORPORATION, Lake Forest, CA (US)

(72) Inventors: Feng Jiang, Laguna Hills, CA (US); Shrenik Shah, Laguna Niguel, CA (US)

(73) Assignee: Panasonic Avionics Corporation, Lake Forest, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/639,770

(22) Filed: Jun. 30, 2017

(65) Prior Publication Data
US 2017/0343150 A1 Nov. 30, 2017

Related U.S. Application Data

(63) Continuation of application No. 15/164,768, filed on May 25, 2016, now Pat. No. 9,695,972.

(51) Int. Cl.
*B60R 11/00* (2006.01)
*F16M 11/04* (2006.01)
(Continued)

(52) U.S. Cl.
CPC ......... *F16M 11/041* (2013.01); *B60R 11/02* (2013.01); *B64D 11/00152* (2014.12);
(Continued)

(58) Field of Classification Search
CPC ... G06F 1/1632; B60R 11/0235; B60R 11/02; B60R 2011/0075; B60R 2011/0015;
(Continued)

(56) References Cited

U.S. PATENT DOCUMENTS 5,927,765 A 7/1999 Austin
6,956,628 B2 10/2005 Huang
(Continued)

FOREIGN PATENT DOCUMENTS

CN 104486920 A 4/2015

*Primary Examiner* — Corey Skurdal
(74) *Attorney, Agent, or Firm* — Brian Furrer

(57) ABSTRACT

A quick-release mounting system for mounting a panel instrument, such as a video monitor, to a mounting surface or support, such as a seatback or other structure. The mounting system comprises one or more mounting mechanisms configured to be mounted to the mounting surface or support. Each mounting mechanism has a locking member coupled to a first main body. The locking member is movable between a locked position in which the locking bolt engages a retaining stud mounted to the back surface of the panel instrument thereby locking the mounting mechanism to the first retaining stud and an unlocked position in which the locking member is disengaged from the first retaining stud. The mounting mechanism also has a cam shaft having a cam fixed in rotation with the cam shaft. The cam is operably coupled to the locking member such that rotation of the cam shaft moves the locking member between the locked and unlocked positions.

21 Claims, 15 Drawing Sheets

(51) Int. Cl.
  *B64D 11/00* (2006.01)
  *F16M 13/02* (2006.01)
  *H05K 5/00* (2006.01)
  *H05K 5/02* (2006.01)
  *B60R 11/02* (2006.01)

(52) U.S. Cl.
  CPC ........... *F16M 13/02* (2013.01); *H05K 5/0017* (2013.01); *H05K 5/0204* (2013.01); *H05K 5/0221* (2013.01); *B60R 2011/0015* (2013.01); *F16M 2200/02* (2013.01)

(58) Field of Classification Search
  CPC ................. F16M 11/041; F16M 13/02; B64D 11/00152; H05K 5/0017; H05K 5/0204; H05K 5/0221
  See application file for complete search history.

(56) References Cited

U.S. PATENT DOCUMENTS

| | | |
|---|---|---|
| 9,360,895 B2 | 6/2016 | Shah |
| 9,457,905 B2 | 10/2016 | Felske |
| 2001/0011664 A1 | 8/2001 | Meritt |
| 2009/0316057 A1 | 12/2009 | Campbell et al. |
| 2011/0267759 A1 | 11/2011 | Abram |
| 2012/0018471 A1 | 1/2012 | Guillermo et al. |
| 2012/0063081 A1 | 3/2012 | Grunwald |
| 2012/0120626 A1 | 5/2012 | Akaike |
| 2012/0145861 A1 | 6/2012 | Collins |
| 2014/0198473 A1 | 7/2014 | Shah et al. |
| 2015/0192956 A1 | 7/2015 | Wharton |

QUICK-RELEASE MOUNTING SYSTEM FOR REMOVABLY ATTACHING A COMPONENT TO A STRUCTURE

CROSS-REFERENCE TO RELATED APPLICATIONS

This application is a continuation of prior, U.S. application Ser. No. 15/164,768, filed on May 25, 2016, issued as U.S. Pat. No. 9,695,972, on Jul. 4, 2017. Priority to the foregoing prior patent application is expressly claimed, and the disclosure of the prior application is hereby incorporated herein by reference in its entirety and for all purposes.

BACKGROUND

The field of the invention generally relates to mounting a panel instrument, such as a video monitor, terminal, or other panel instruments, to a mounting surface or support, such as the back of an airline passenger seat, and more particularly, to a quick-release mounting system for securely and conveniently mounting a panel instrument to a mounting surface or support.

Vehicle passenger seats, such as passenger seats in aircraft, trains, automobiles, etc., often serve as mounting locations for video monitors and other panel mounted instruments, such as control panels, terminals, and other devices sometimes referred to as line replaceable units ("LRUs"). Such devices are referred to herein as "panel instruments." For example, vehicle entertainment systems for various types of vehicles may have video displays installed at each passenger seat, such as mounted in the seatbacks of the passenger seats, and/or on cabin walls, i.e., in the first row of a section.

Typical methods for mounting panel instruments, such as video monitors, on mounting surfaces such as seatbacks, cabin walls and other suitable mounting surface or support, include attaching brackets, bezels, and/or covers for the video display to the mounting surface/support using screws extending through the mounting surface to the back surface of the panel instrument. In the case of a video monitor mounted to the back of a passenger seatback, the heads of the screws are located under the upholstery of the seat. Accordingly, the upholstery must be removed in order to access the screws in order to install or remove a video monitor, which is very time consuming.

SUMMARY

In one embodiment, the present invention is directed to an innovative quick-attach, quick-release, mounting system for mounting a panel instrument, such as a video monitor, to a mounting surface or support, such as a passenger seatback or other structure, which allows the video monitor to be quickly and easily installed and removed by accessing the locking mechanism from the front of the panel instrument. The mounting system also safely and securely locks the panel instrument in place to prevent theft or unauthorized tampering of the panel instrument. For instance, the actuator for the locking mechanisms may be concealed and/or include a custom tool interface such that a specialized tool is required to actuate the locking mechanism. The mounting system may be utilized to mount any panel instrument, such as a video monitor, terminal, LRU, etc., to any suitable mounting surface or support, such as a vehicle seatback in aircraft, trains, automobiles, etc.

Accordingly, in one embodiment of the present invention, a mounting apparatus comprises a mounting mechanism having a main body configured to be mounted to the mounting surface or support. For example, the main body may have mounting holes for receiving bolts or screws for attaching the main body to the mounting surface. The mounting mechanism has a locking member movably coupled to the first main body. The locking member is configured to be movable between a locked position in which the locking member engages the retaining stud mounted to the back surface of the panel instrument thereby locking the mounting mechanism to the first retaining stud and an unlocked position in which the locking member is disengaged from the first retaining stud. The mounting mechanism also has a cam shaft having a cam fixed in rotation with the cam shaft. The cam is operably coupled to the locking member such that rotation of the cam shaft in a first rotational direction (e.g., clockwise) causes the cam to move the locking member to the unlocked position, and rotation of the cam shaft in a second rotational direction (e.g., counter-clockwise) opposite the first rotational direction causes the cam to allow (or to positively move) the locking member to move toward the locked position. For example, a biasing spring may be provided which biases the locking member toward the locked position.

In another aspect, the cam shaft has a first end which extends beyond the outer edge of the panel instrument when the panel instrument is mounted to the mounting surface using the mounting assembly. In this way, when the panel instrument is mounted to the mounting surface, the first end of the cam shaft is accessible from in front of the panel instrument. The first end of the cam shaft has a tool hole to receive a tool for rotating the cam shaft. The tool hole is located outwardly from the outer edge of the panel instrument when the panel instrument is mounted to the mounting surface using the mounting system.

In another embodiment, the mounting mechanism may be part of a mounting system. The mounting system may comprise a first mounting assembly for mounting a panel instrument to a mounting surface. The first mounting assembly is configured to be attached to the mounting surface and to be easily attached and detached to one or more retaining studs attached to a back surface of the panel instrument, as described below. The first mounting assembly comprises one or more mounting mechanisms, as described above.

The operation of the mounting system to install and remove a panel instrument is very straightforward. First, the mounting assembly is attached to the mounting surface, such as by using screws or other suitable fasteners. Then, the retaining stud is attached to the back surface of the panel instrument. For instance, the retaining stud may have a threaded shaft which can be threaded into a mating threaded hole on the back surface of the panel instrument. The retaining stud may be pre-installed to the back surface of the panel instrument such that the panel instrument is prepared to be mounted to the mounting system. The back surface of the panel instrument is then aligned with the mounting surface with the retaining stud aligned with the mounting mechanism. The panel instrument is then pressed toward the mounting mechanism and the retaining stud engages the locking member. The retaining stud and/or locking member bolt may have lead-ins, such as tapered surface(s) such that advancing the retaining stud into engagement with the locking member moves the locking member to the unlocked position until the locking bolt clears a head of the retaining bolt. Once it clears, the locking member slides to the locked position in which the locking member engages the retaining stud. The locking member may move to the locked position by the force of a biasing spring as described above, or by the force of the cam via rotation of the cam shaft and cam. Because the first end of the cam shaft extends beyond the outer edge of the panel instrument and the tool hole is located outwardly of the outer edge, a tool may be inserted into the tool hole and used to rotate the camshaft and cam in the second rotational direction which causes the cam to force the locking member to the locked position. The installed panel instrument is removed by inserting a tool into the tool hole and rotating the cam shaft in the first rotational direction which causes the cam to move the locking member to the unlocked position in which it allows the retaining stud to be removed from the mounting mechanism. The panel instrument can then be pulled from the mounting mechanism.

In another aspect of the present invention, the first mounting assembly may include a second mounting mechanism having the same configuration as the first mounting mechanism and actuate by the same cam shaft as the first mounting mechanism. The second mounting mechanism attaches to the mounting surface spaced apart from, and generally parallel to the first mounting mechanism, and located to attach to a second retaining stud. The cam shaft has a second cam fixed in rotation with the cam shaft such rotation of the cam shaft locks and unlocks the second mounting mechanism in sync with the first mounting mechanism. The first mounting assembly may further include additional mounting mechanisms, configured the same as the first and second mounting mechanism, and similarly coupled to the cam shaft.

In still another aspect of the present invention, the mounting system may further comprise a second mounting assembly having the same configuration as the first mounting assembly and configured to be mounted to the mounting surface spaced apart and arranged parallel to the first mounting assembly such that the cam shaft of the second mounting assembly is parallel to the cam shaft of the first mounting assembly. The use of this mounting system is similar to the method described above, except that a tool is inserted into the respective tool hole of each of the cam shafts and each of the cam shafts are rotated to the appropriate locked and unlocked positions.

In still another feature of the present invention, the main body and/or locking member of the mounting mechanism(s) may have specific configurations. For example, the main body may have a top surface configured to bear against the mounting surface and an opposing bottom surface which faces the back surface of the panel instrument. The main body has a cylindrical locking bolt hole extending along a longitudinal first axis from a first side of the main body into the main body. The main body further includes a retainer hole extending from the bottom surface and intersecting the locking bolt hole and configured to receive a retaining stud mounted to the back surface of the panel instrument. The main body also has a cam shaft hole extending through a second side of the first main body and extending substantially transverse to, and intersecting, the locking bolt hole.

The locking member may comprise a locking bolt having substantially cylindrical shaft having a longitudinal shaft axis. The locking bolt has a conical first tip portion at a distal end of the locking bolt, a cylindrical portion at a proximal end of the locking bolt and a cam portion between the distal end and the proximal end of the locking bolt. The cam portion has a cam surface, such as a notch in the cylindrical shaft which provides the cam surface. The cam surface may be oriented substantially transverse to the shaft axis. The cam is positioned proximate the cam surface, such as within the notch, such that the cam bears against the cam surface.

In still another aspect, the locking member may comprise a locking latch rotatably coupled to the main body and rotatable about a pivot axis. The locking latch has a locking tip at a first end of the locking latch, and a cam surface at a second end of the locking latch. The locking member is configured to be rotatable from a locked position in which the locking tip engages the first retaining stud received in the first retainer hole thereby locking the retaining stud to the first mounting mechanism and an unlocked position in which the locking tip is disengaged from the first retaining stud received in the first retainer hole. The first cam is positioned adjacent the cam surface such that rotation of the cam shaft in the first rotational direction causes the first cam to rotate the locking latch to the unlocked position, and rotation of the cam shaft in the second rotational direction causes the first cam to release the cam surface thereby allowing the biasing spring to rotate the locking latch to the locked position.

In still another aspect, the mounting system may be configured such that the retaining bolts are attached to the mounting surface and the mounting assembly(ies) are attached to the back surface of the panel instrument.

BRIEF DESCRIPTION OF THE DRAWINGS

The foregoing and other aspects of embodiments are described in further detail with reference to the accompanying drawings, wherein like reference numerals refer to like elements and the description for like elements shall be applicable for all described embodiments wherever relevant.

DETAILED DESCRIPTION

The present invention is directed to a mounting system for mounting a panel instrument, such as a video monitor, to a mounting surface or support, such as a passenger seatback or other structure. For instance, the mounting system may be used to mount a panel instrument to a passenger seatback in aircraft, trains, automobiles, buses, or other vehicles, as well as to any other suitable mounting surface/support. Although the embodiments described herein are directed to a mounting system for mounting a video monitor to a seatback, such as an aircraft passenger seatback, the present invention is not limited to such installations, but can be utilized on any type of vehicle, on any type of vehicle seat, on seatbacks not in a vehicle, or on any other suitable mounting surface.

Figure 1:
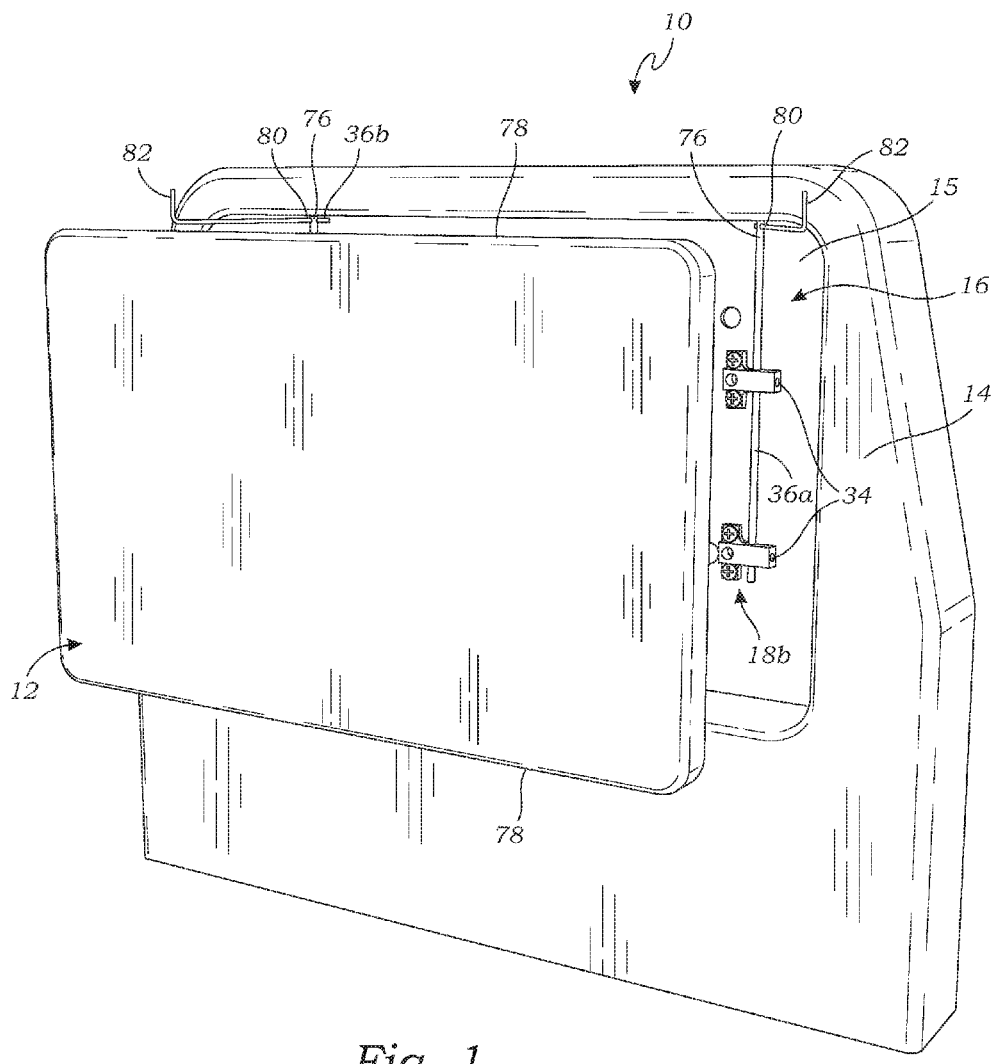
FIG. 1 is a front, perspective view of a mounting system being used for mounting a video monitor onto a recessed mounting surface or support, with the video monitor uninstalled from the mounting system, according to one embodiment of the present invention.
Figure 2:
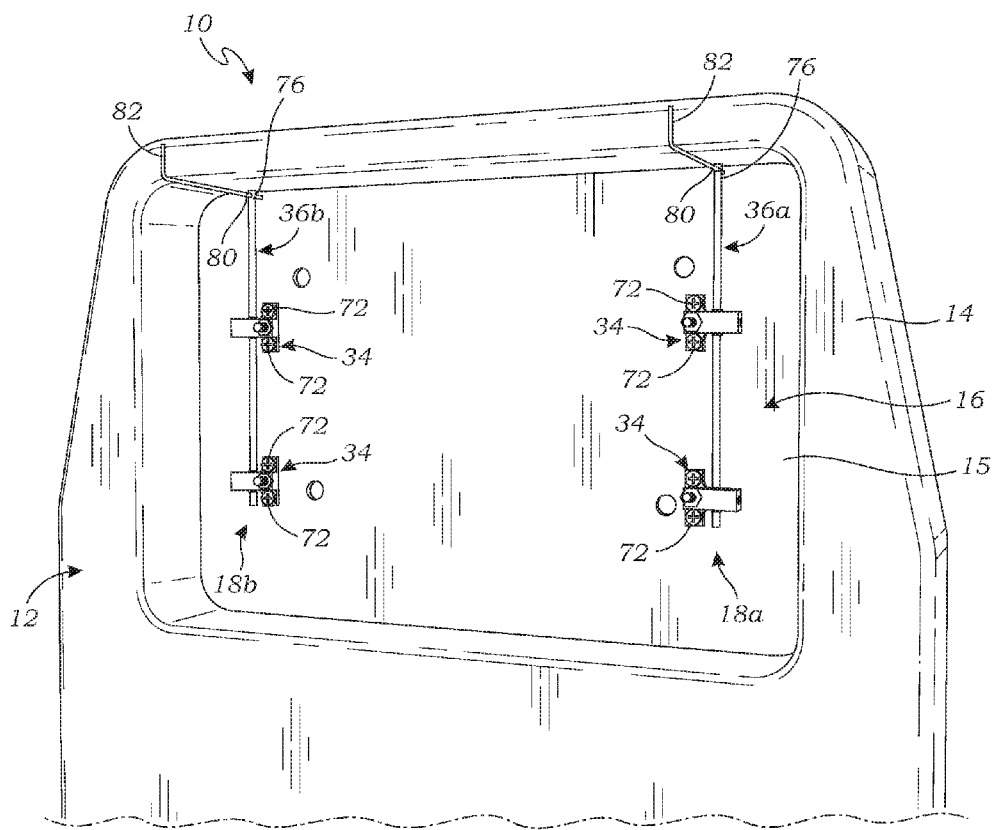
FIG. 2 is a front, perspective view of the mounting system of FIG. 1 with the video monitor not shown in order to illustrate the retaining studs being attached to the mounting assemblies installed on the mounting surface.
Figure 3:
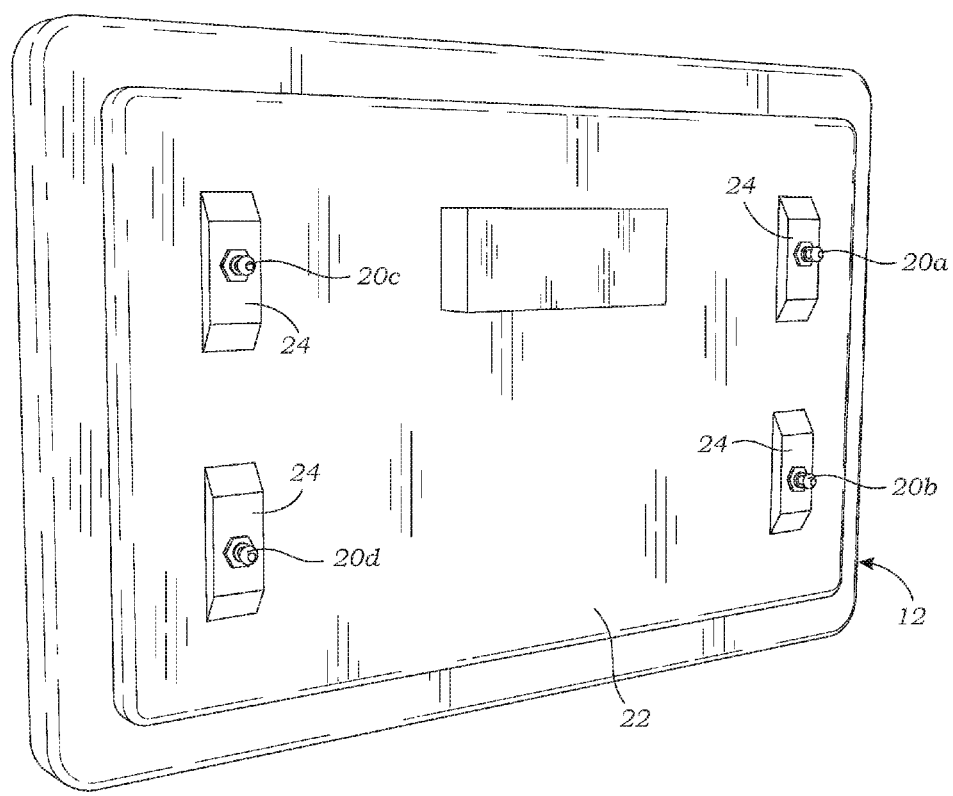
FIG. 3 is rear, perspective view of the video monitor of FIG. 1 showing the retaining studs installed on the back surface of the video monitor.
Figure 4:
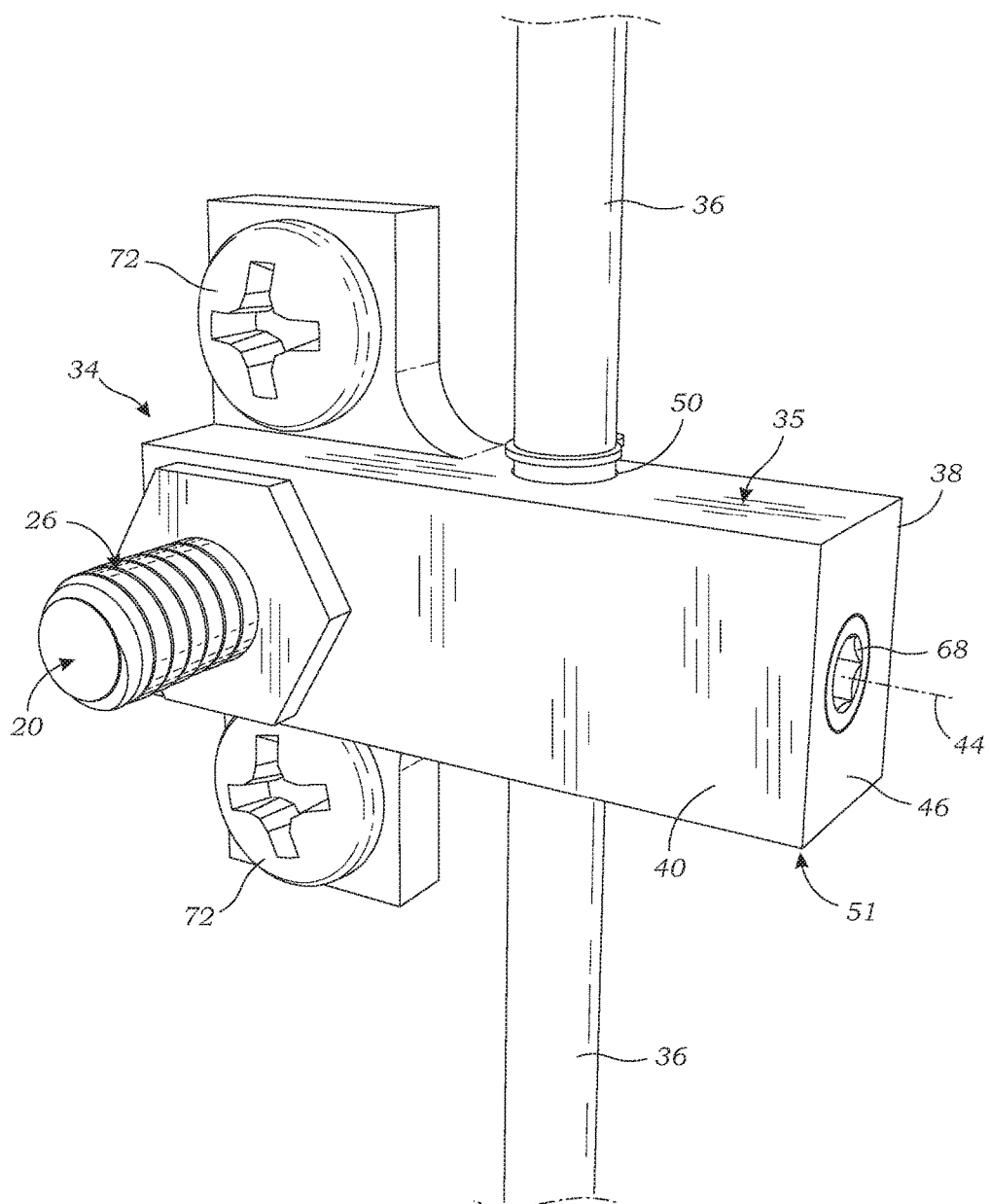
FIG. 4 is an enlarged, perspective view of one of the mounting mechanisms of the mounting system of FIG. 1.

Referring to FIGS. 1-3, one embodiment of a mounting system 10 for mounting an instrument panel 12, in this case a video monitor 12, into a mounting recess 16 of a passenger seatback 14 is illustrated. In this described embodiment, the mounting system 10 comprises a pair of mounting assemblies 18a and 18b (referred to collectively as element "18"). The mounting assemblies 18 are shown attached to a mounting surface or support 15 within the mounting recess 16 of the passenger seatback 14. As illustrated, the mounting support 15 is a fixed surface. The mounting support 15 may be also be a tiltable or pivotable support, such that after the video monitor 12 is mounted, the viewing angle may be adjusted by pushing or pulling an edge of the video monitor. The mounting assemblies 18 removably attach to the respective retaining studs 20a, 20b, 20c and 20d (referred collectively as element "20") which are attached to the back surface 22 of the video monitor 12 as best shown in FIG. 3.

Still referring to FIG. 3, the retaining studs 20 may be attached to the back surface 22 of the video monitor by fastening them to mounting pads 24 on the back surface 22. The retaining studs 20 may be threaded such that they are fastened to the mounting pads 24 by screwing them into mating threaded holes in the mounting pads 24. As better shown in FIGS. 5 and 6, the retaining studs 20 comprises a threaded shaft 26, a collar 28 adjacent the threaded shaft 26, a mid-shaft 30 extending from the collar 28 and having a smaller diameter than the collar 28, and a head 32 on the other end of the mid-shaft 30 having a larger diameter than the mid-shaft 30. The head 32 has a conical, tapered portion 33.

Returning to FIG. 2, each of the mounting assemblies 18 comprises two mounting mechanisms 34, and a respective cam shaft 36a, 36b. Turning now to FIGS. 4-8, the mounting mechanisms 34 will be described in detail with respect to these enlarged views. The mounting mechanism 34 has a main body 35 which is the main structural part of the mounting mechanism 18. The main body 35 may be formed of any suitable metal, such as steel, aluminum, etc. or any suitable polymer material. The main body 35 has a substantially flat top surface 38 which bears against the mounting surface 15 and a bottom surface 40 opposing the top surface 38 which faces the back surface 22 of the video monitor 12.

The main body 35 has a cylindrical locking bolt hole 42 (see FIG. 6) extending along a longitudinal axis 44 from a first side 46 of the main body 35 and into the main body. The main body 35 also has a retainer hole 48 extending from the bottom surface 40 and intersecting the locking bolt hole 42. The retainer hole 48 is sized to receive the retaining stud 20, and accordingly has a diameter slightly larger than the head 32 of the retaining stud 20. The retainer hole 48 may extend all the way through the top surface 38 of the main body, but it does not have to. The main body 35 also has a cam shaft hole 50 extending through a second side 51 of the main body 35. The cam shaft hole 50 extends substantially transverse to, and intersects, the locking bolt hole 42. The cam shaft hole 50 rotatably receives the cam shaft 36.

Figure 5:
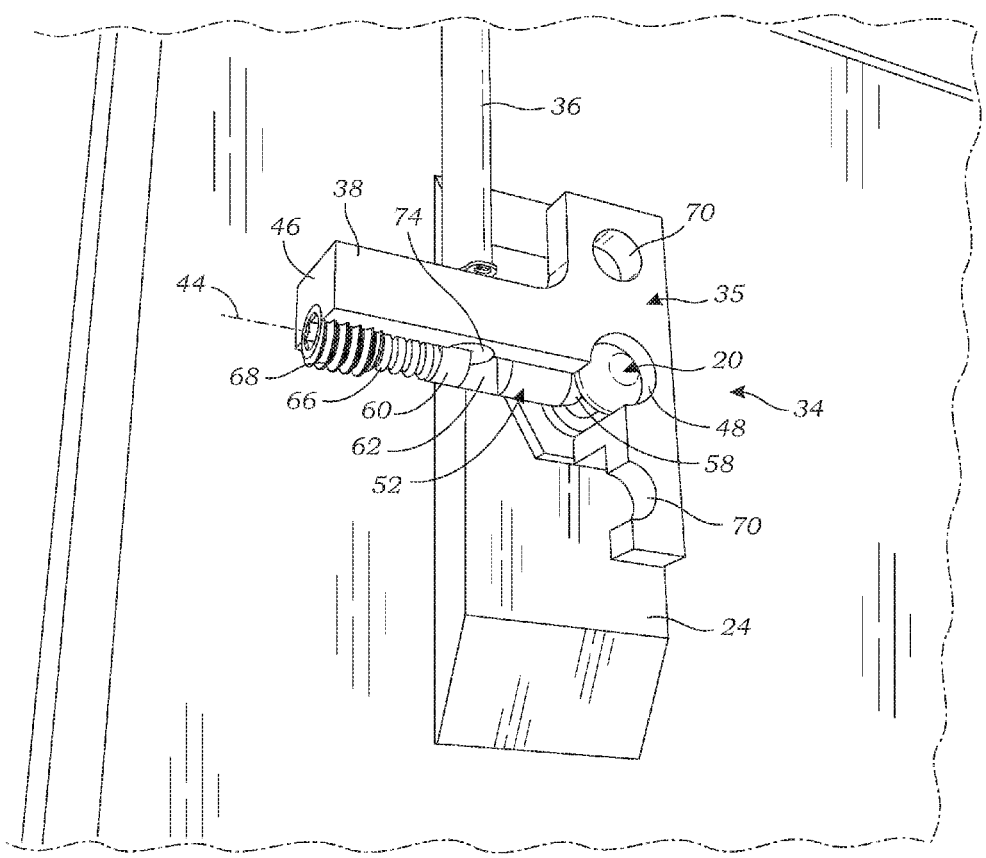
FIG. 5 is an enlarged, partial cutaway, perspective view of the mounting mechanism of FIG. 4 showing the mounting mechanism in a locked position.
Figure 6:
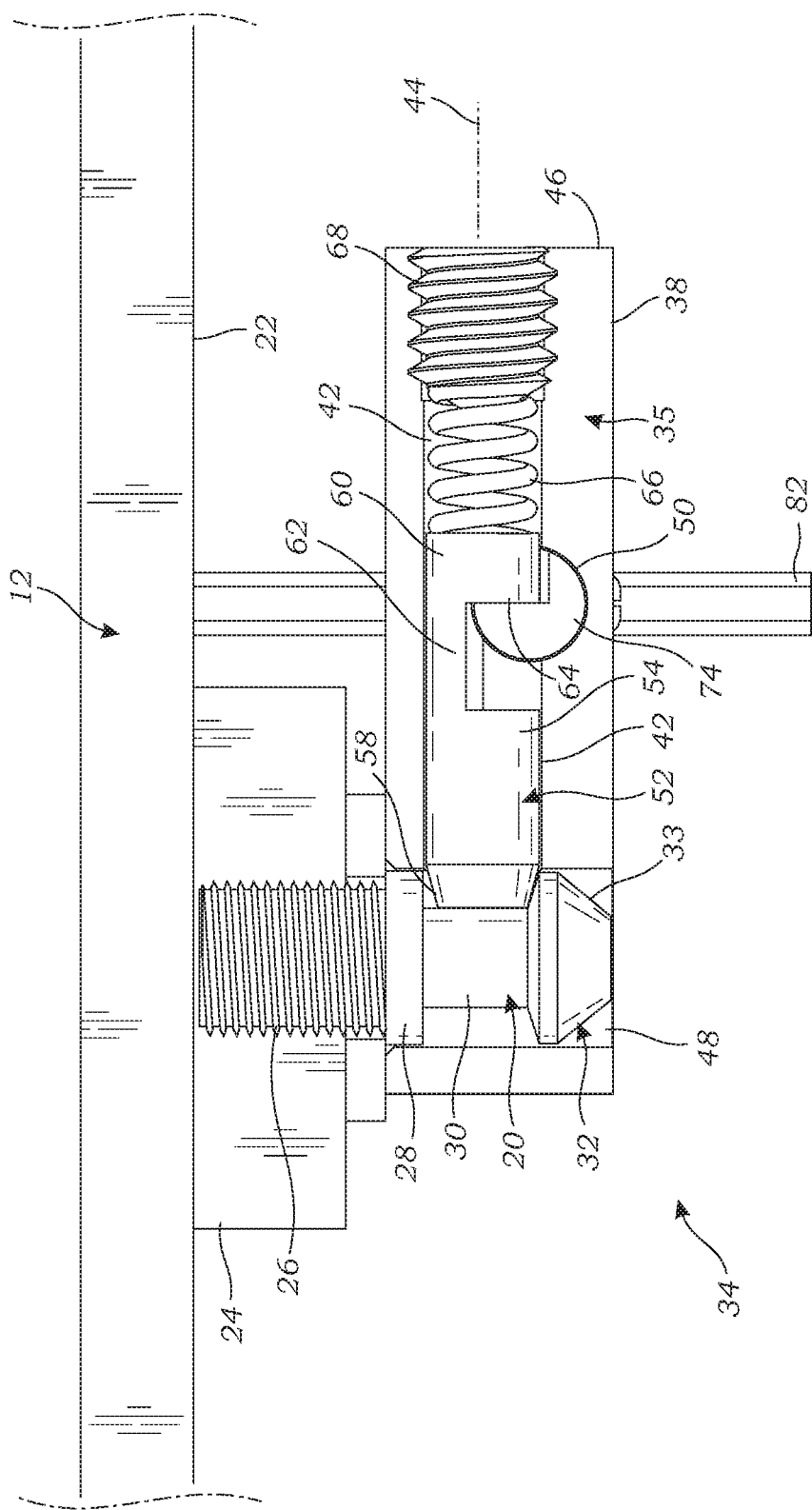
FIG. 6 is an enlarged, cross-sectional view of the mounting mechanism of FIG. 4, showing the mounting mechanism in a locked position.
Figure 7:
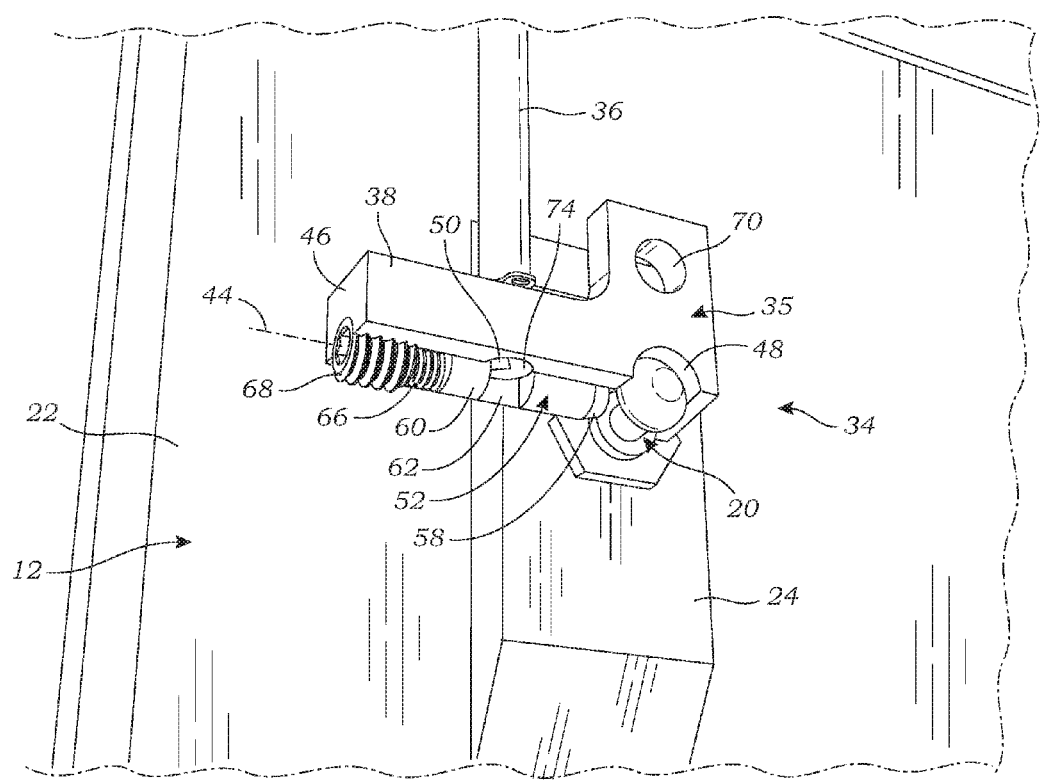
FIG. 7 is an enlarged, partial cutaway, perspective view of the mounting mechanism of FIG. 4, showing the mounting mechanism in an unlocked position.
Figure 8:
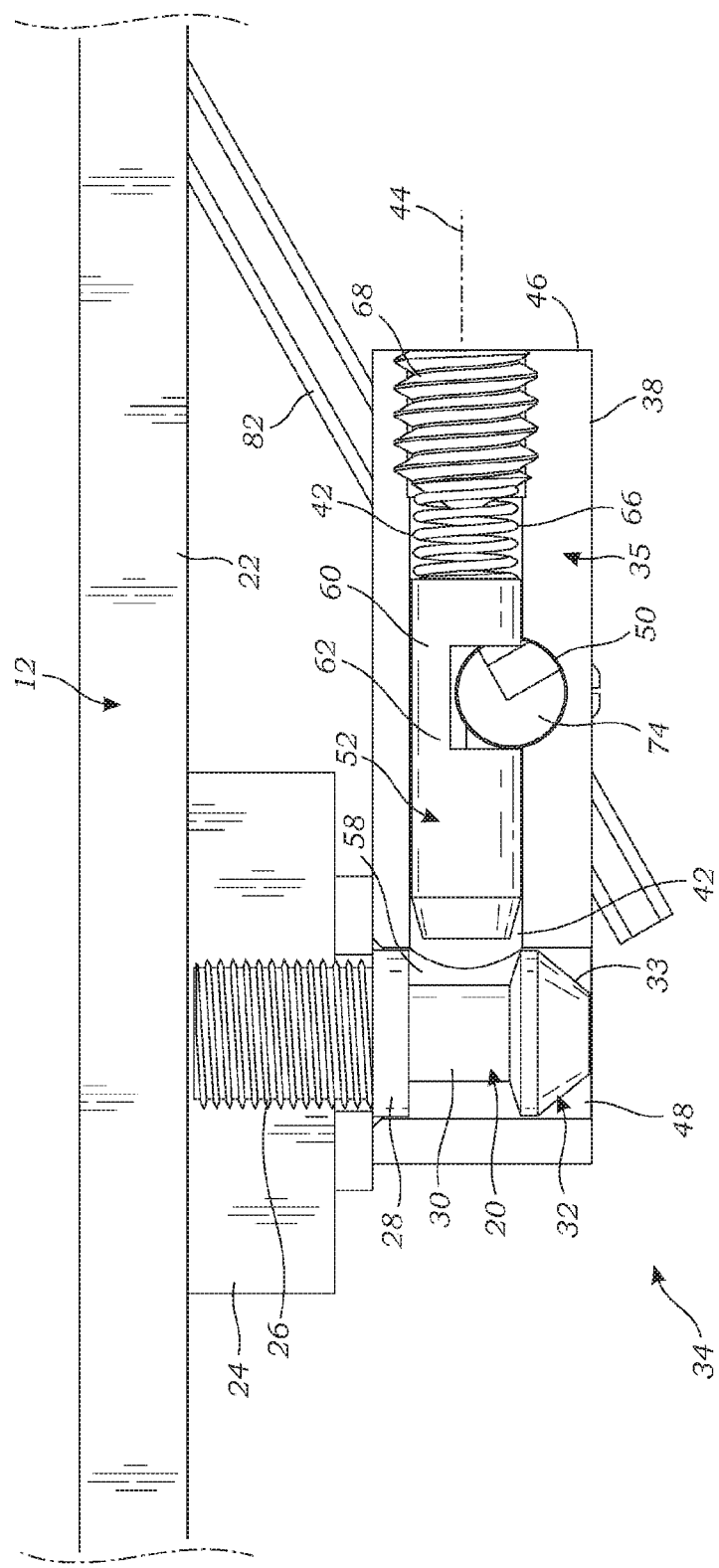
FIG. 8 is an enlarged, cross-sectional view of the mounting mechanism of FIG. 4, showing the mounting mechanism in an unlocked position.

The mounting mechanism 34 has a locking bolt 52 slidably received in the locking bolt hole 42. The locking bolt 52 has a substantially cylindrical shaft 54 which extends along an axis 44. The locking bolt has a conical tip portion 58 at its distal end, a cylindrical portion 60 at its proximal end, and a cam portion 62 between the conical tip portion 58 and the cylindrical portion 60. The cam portion 62 may be formed by a notch in the cylindrical shaft 54 which provides a cam surface 64 which is oriented substantially transverse to the axis 44. The locking bolt 52 is slidable within the locking bolt hole 42 between a locked position (as shown in FIGS. 5 and 6) in which the tip portion 58 is advanced into the retainer hole 48 such that the tip portion 58 is positioned in the slot formed between by mid-shaft 30, head 32 and collar 28 of the retaining stud 20 thereby locking the retaining stud 20 received in the retainer hole 48 within the mounting mechanism 34, and an unlocked position (as shown in FIGS. 7 and 8) in which the locking bolt 52 is retracted from the retainer hole 48 such that the conical tip portion 58 is retracted distal of the head 32 thereby allowing the retaining bolt 20 to slide completely out of the retainer hole 48.

The mounting mechanism 34 also has a biasing spring 66 disposed in the locking bolt hole 42 proximal to the locking bolt 52. The biasing spring 66 has a first side bearing against the distal end of the locking bolt 52. The biasing spring 66 is in compression so as to bias the locking bolt 52 toward the locked position. A threaded cap screw 68 may threaded onto the proximal end of the locking bolt hole 42 to retain the biasing spring 66 and locking bolt 52 within the locking bolt hole 42.

The main body 35 also has two or more mounting holes 70 for mounting the mounting mechanism 34 to the mounting surface 15. For example, the main body 35 can be attached to the mounting surface 15 using screws 72 inserted through the mounting holes 70 and threaded into the mounting surface 15.

As described above, each of the mounting assemblies 18 has a cam shaft 36 extending through the respective cam shaft holes 50. Each cam shaft 36 has a first cam 74 fixed in rotation with the cam shaft 36. The first cam 74 is disposed within the cam portion 62 of one of the mounting mechanisms 34 such that the first cam 74 bears against the cam surface 64. Each cam shaft also has a second cam 74 fixed in rotation with the cam shaft 36, and disposed within the cam portion 62 of the other one of the mounting mechanisms 34 of each mounting assembly 18 such the second cam 74 bears against the cam surface 64. The cams 74 are configured such that rotation of the cam shaft 36 in a first rotational direction causes the cams 74 to push the respective cam surfaces 64 thereby moving the respective locking bolts 52 toward the unlocked position (see FIGS. 7 and 8), and rotation of the respective cam shaft 36 in the second rotational direction causes the respective cams 74 to release the respective cam surfaces 64 thereby allowing the respective biasing springs 66 to move the respective locking bolts 52 into the locked position (see FIGS. 5 and 6).

Figure 9:
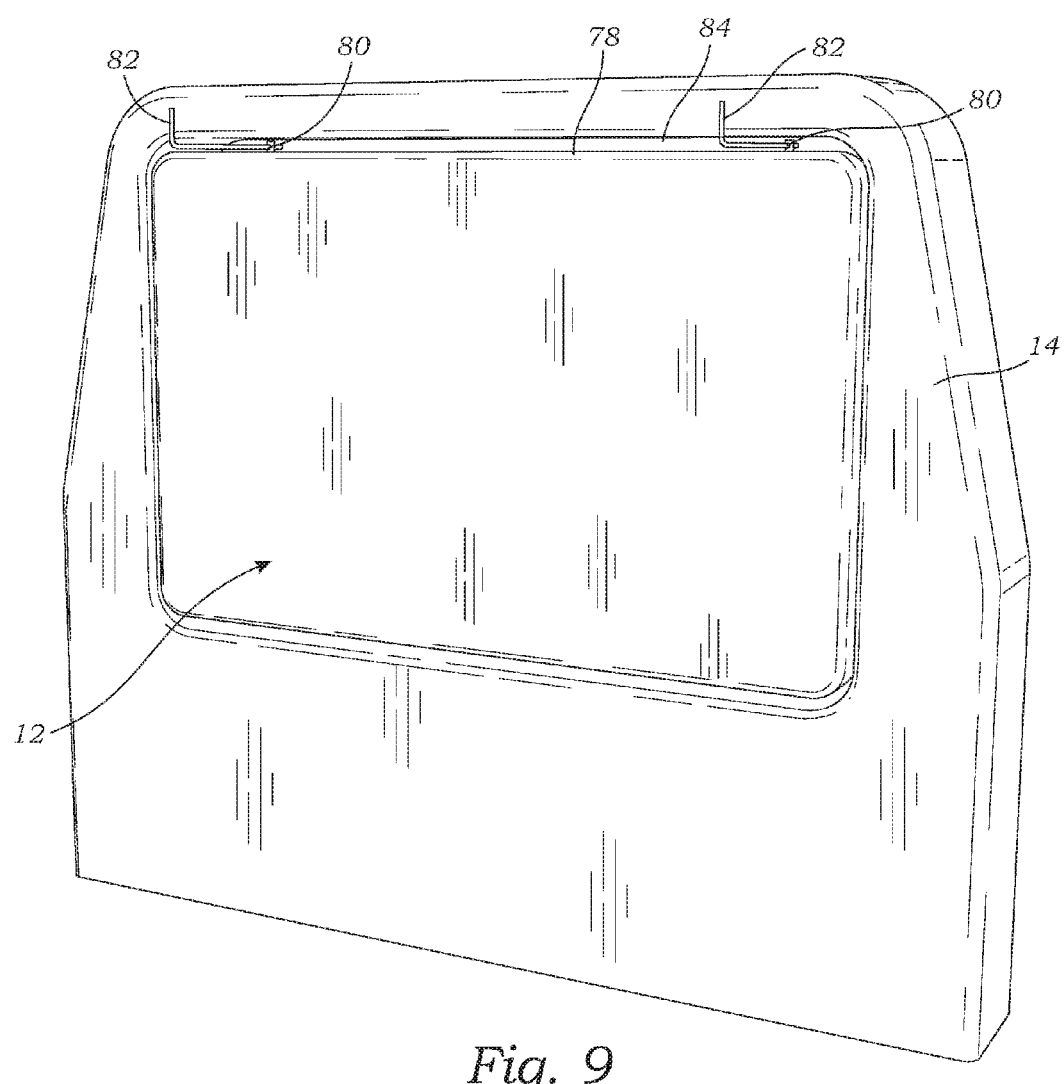
FIG. 9 is a front, perspective view of the mounting system of FIG. 1 showing the video monitor installed on the mounting surface using the mounting system.
Figure 10:
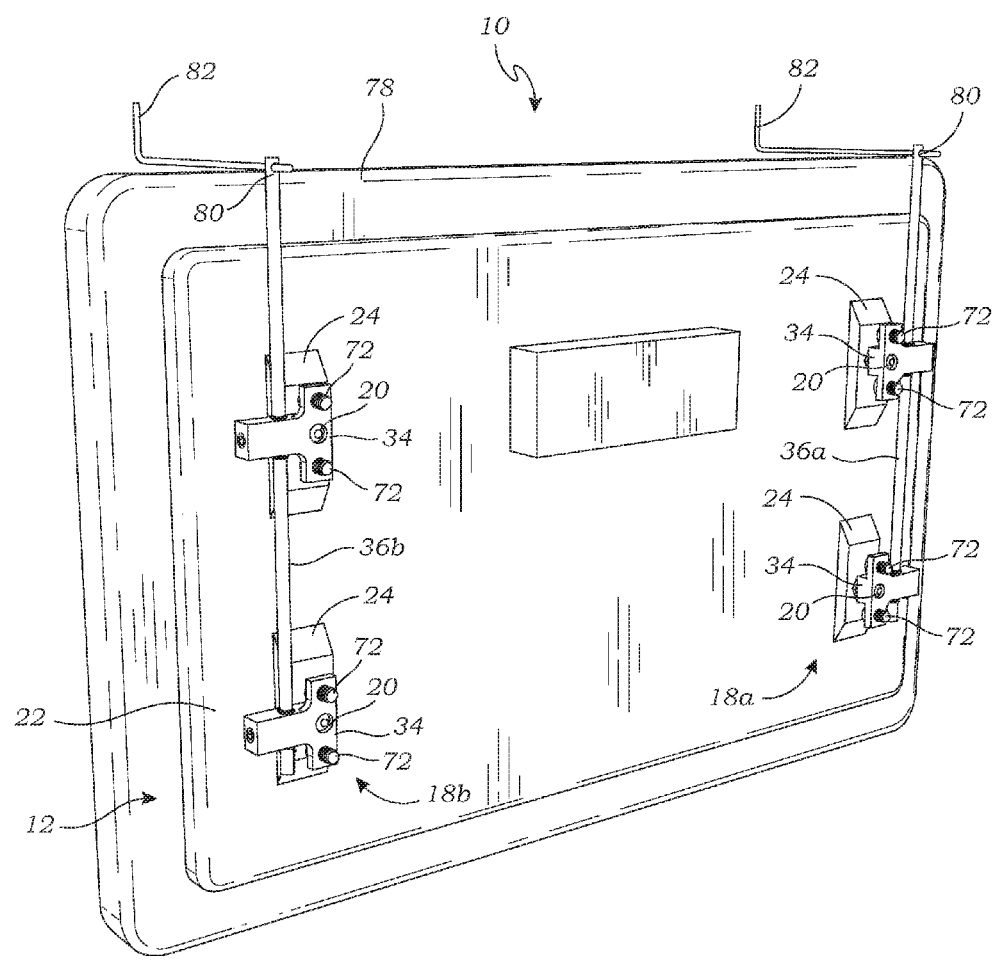
FIG. 10 is a rear, perspective view of the mounting system of FIG. 1 without the mounting surface shown in order to illustrate the video monitor installed onto the mounting system.
Figure 11:
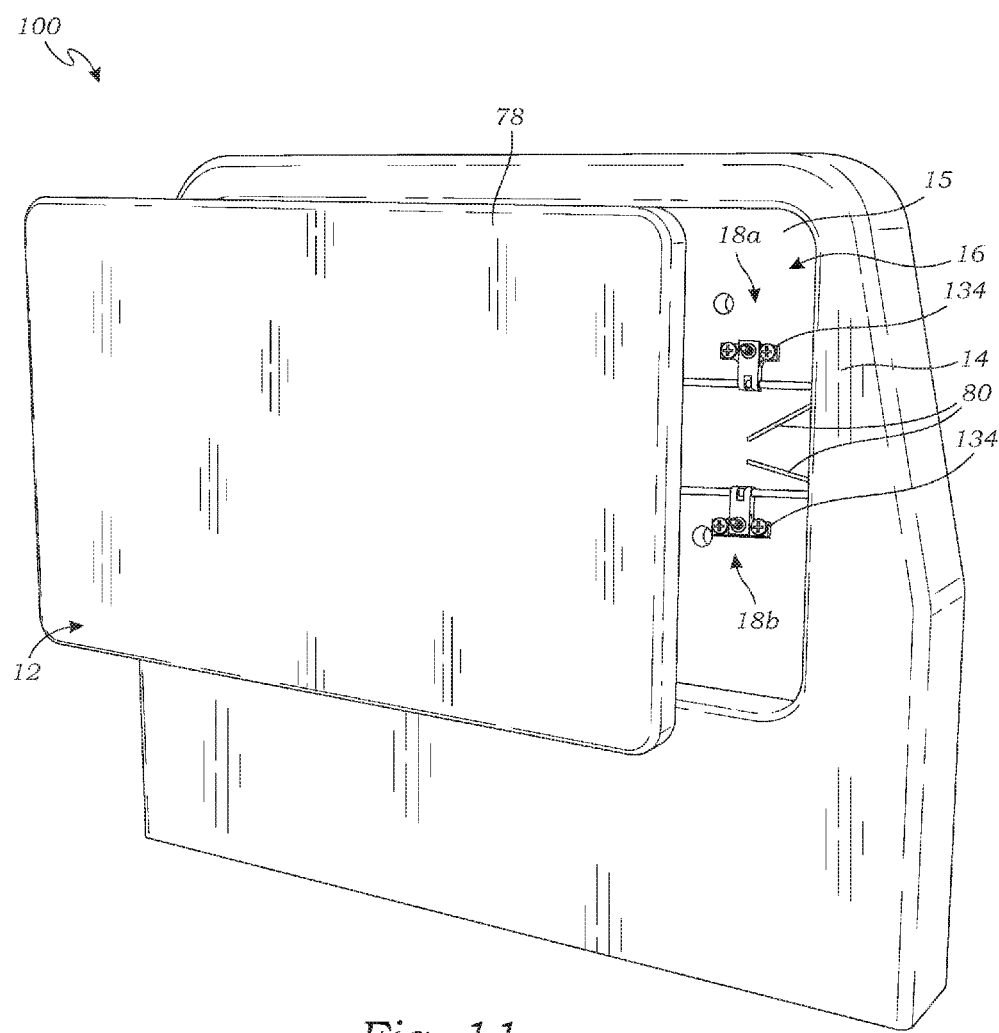
FIG. 11 is a front, perspective view of a mounting system being used for mounting a video monitor onto a recessed mounting surface, with the video monitor uninstalled from the mounting system, according to another embodiment of the present invention.
Figure 12:
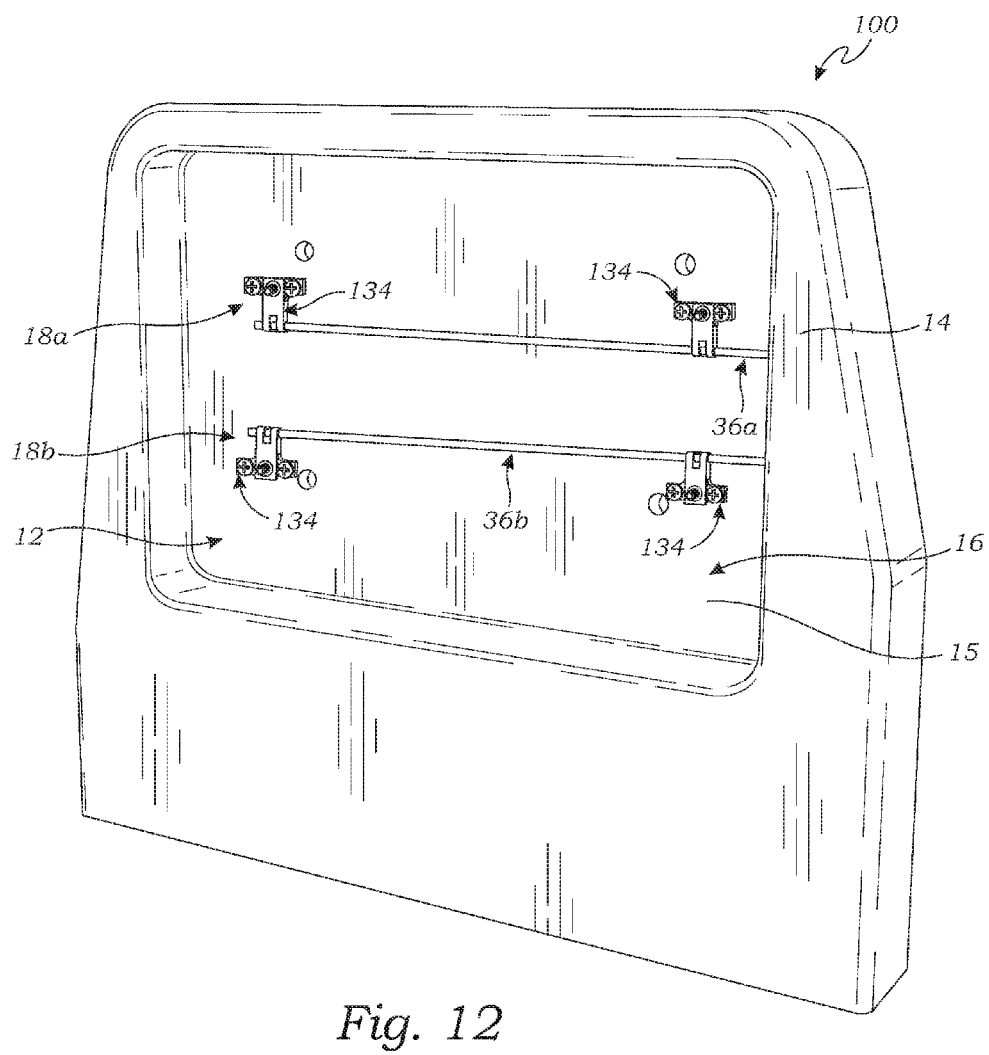
FIG. 12 is a front, perspective view of the mounting system of FIG. 11 with the video monitor not shown in order to illustrate the retaining studs being attached to the mounting assemblies installed on the mounting surface.

The cam shafts 36 extends through the respective mounting mechanisms 34 to very near the edge of the mounting recess 16, such that a first end 76 of the cam shaft 36 is beyond the outer edge 78 of the panel instrument 12, as best shown in FIGS. 2, 9 and 10. In the described embodiment, the first end 76 of the cam shaft 36 extending through the upper mounting mechanism 36a and 36b extends to beyond the top outer edge 78, but alternatively, it could extend through the bottom mounting mechanism 36c and 36d to beyond the bottom outer edge 78. The cam shaft 36 has a tool hole 80 proximate the first end 76 which is configured to receive a tool 82, such as an Allen wrench. The tool hole 80 is located so that the tool 82 can be inserted though the gap 84 (see FIG. 9) between the outer edge 78 of the instrument panel 12 and the edge of the mounting recess 16 to access the tool hole 80 with the instrument panel 12 installed and attached to the mounting mechanisms 34. The tool hole 80 may have a specialized tool interface, such as a special shape, for instance a Torx screw head, or special geometry hole other than a simple circular hole. This can further secure the mounting assemblies 18 from tampering and prevent theft or tampering of the instrument panel 12. In such case, the tool 80 must then be a specialized tool which mates with the specially designed tool hole 80. Also, the tool hole 80 is oriented on the first end 76 of the cam shaft 36 such that the tool hole 80 is facing outward from the mounting surface 15. For example, the tool hole 80 may be oriented such that in the locked position, the tool hole 80 faces straight outward.

Referring primarily to FIGS. 1-3, 9 and 10, the installation and operation of the mounting system 10 will now be described. First, the mounting system 10 is installed on the mounting surface 15 and the back surface 22 of the video monitor 12. Each of the mounting assemblies 18a and 18b are attached to the mounting surface 15 by attaching each of the mounting mechanisms 34 to the mounting surface. This may be accomplished using screws 72 inserted through the mounting holes 70 and screwing them into the mounting surface 15 (see FIG. 2). The retaining studs 20 are attached to the back surface 22 of the video monitor 12. At this point, each of the respective locking bolts 52 are biased into the locked position with the tip portion extending into the retaining hole 48.

In order to install the video monitor 12 to the mounting surface 15 using the mounting system 10, the back surface 22 of the video monitor 12 is aligned with the mounting surface 15 such that each of the retainer holes 48 of each of the mounting mechanisms 34 is aligned with a respective retaining stud 20. The video monitor 20 is then pressed toward the mounting mechanisms 34 such that the retaining studs 20 enter the retainer holes 48 and engage the respective locking bolts 52. As the retaining studs 20 enter the retainer holes 48, the tapered portion 33 of the retaining studs 20 contacts the conical tip portion 58 of the locking bolts 52, which pushes the locking bolts 52 into the unlocked position such that the retaining studs 20 can be fully inserted into the retainer holes 48 where each of the heads 32 clears the respective tip portion 58. Thus, the tools 82 are not necessarily required to install the video monitor 12 using the mounting system 10, although they may be used if desired. Once the head 32 clears, the respective locking bolts 52 are biased by the biasing spring 66 back to the locked position with the tip portion 58 inserted into the slot formed between by mid-shaft 30, head 32 and collar 28 of the retaining stud 20. This position locks the retaining stud 20 in the retainer hole 48 within the mounting mechanism 34. The video monitor 20 is now installed and locked to the mounting surface 15 using the mounting system 10, as shown in FIG. 9. FIG. 10 also shows the installed video monitor 20 as viewed from the back side of the mounting surface 15 with the mounting surface 15 not shown for illustration purposes.

To remove the video monitor 12 mounted to the mounting surface 15 using the mounting system 10, a tool 82 is inserted into each of the tool holes 80 of the respective mounting assemblies 18a and 18b. In the described embodiment, the tool holes are oriented such that the axis of the tool holes 80 is perpendicular to mounting surface 15 in the locked position. Accordingly, the shafts of the tools 82 extend straight out perpendicular to the mounting surface 15 (and the screen of the video monitor 12) in their respective locked positions, as shown in FIGS. 2, 6, 9 and 10. However, the shaft of the tools 82 may extend an angle other than perpendicular so long as the angle is sufficient for someone to rotate each cam shaft 36a and 36b. Hence, the axis of the tool holes 80 need not be perpendicular to the mounting surface or support 15, and may be at angle. Notwithstanding, a perpendicular angle makes it easier to insert the shaft of each tool 82 therein and rotate the cams and thus is the optimum angle.

The tools 82 are rotated to rotate the respective cam shafts 36a and 36b in their respective first rotational directions, which depending on the orientation of the mounting assemblies 18a and 18b, may be in the same direction or different directions. For instance, in the example shown in the figures, the mounting assembly 18a is oriented with the locking bolt 52 facing the opposite direction of the locking bolt 52 of the mounting assembly 18b, such that the first rotational direction for the mounting assembly 18a is counter-clockwise and the first rotational direction for the mounting assembly 18b is clockwise. Accordingly, to unlock the mounting mechanisms 34, the cam shaft 18a is rotated counter-clockwise and the cam shaft 18b is rotated clockwise, to their respective unlocked positions as shown in FIGS. 1 and 8. As the cam shafts 18 are rotated to their unlocked positions, the respective cams 74 push the respective locking bolts 52 to the unlocked position which moves the respective tapered portions 58 out of the retainer hole 48 such that the respective retaining studs 20 are free to slide out of the respective retainer holes 48. The video monitor 12 is then pulled outward away from the mounting surface 15 such that the respective retaining studs 20 slide out and are removed from the retainer holes 48, and the video monitor 12 is now removed from the mounting mechanism 10 as shown in FIG. 1.

Turning now to FIGS. 11-16, another embodiment of a mounting system 100 for mounting an instrument panel 12, again a video monitor 12, into a mounting recess 16 of a passenger seatback 14 is illustrated. The mounting system 100 is very similar to the mounting system 10, described above, except that the mounting mechanisms 134 in the mounting system 100 have a different design than the mounting mechanisms 34 of the mounting system 10. Accordingly, like reference numbers in FIGS. 11-16 to the reference numbers in FIGS. 1-10 refer to like elements, and the description of such elements with respect to the embodiment of FIGS. 1-10 applies equally to the embodiment of FIGS. 11-16, and is not repeated. As shown in FIGS. 11-16, it can be seen that the mounting assemblies 18 are oriented horizontally instead of vertically as in the embodiment of FIGS. 1-10. It is understood that either of the embodiments can be oriented vertically or horizontally, as desired.

Figure 13:
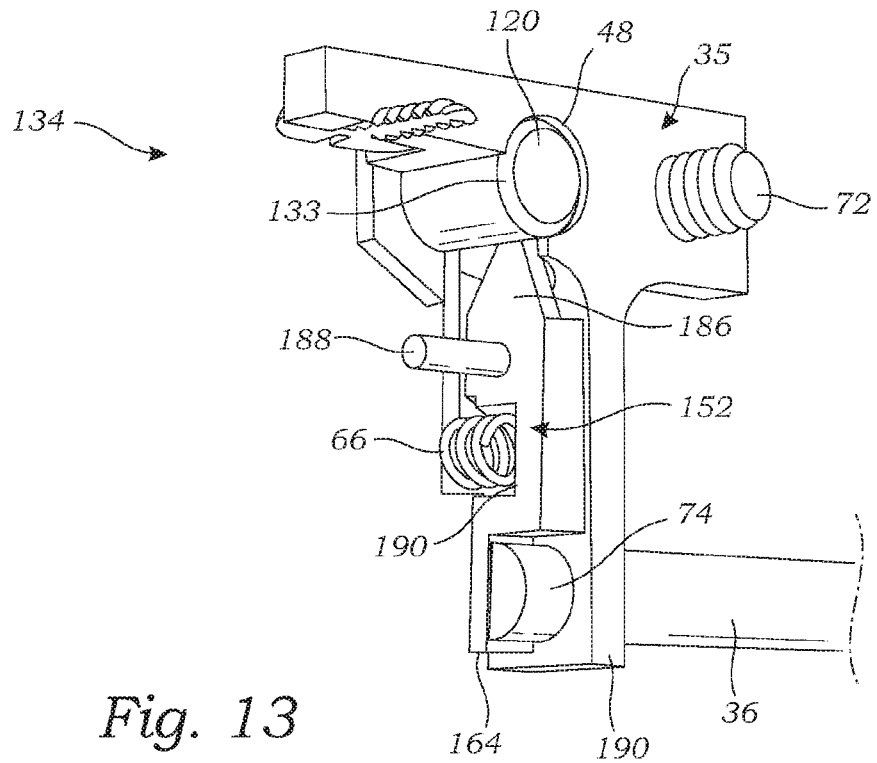
FIG. 13 is an enlarged, partial cutaway, perspective view of one of the mounting mechanisms of the mounting system of FIG. 11 showing the mounting mechanism in a locked position.
Figure 14:
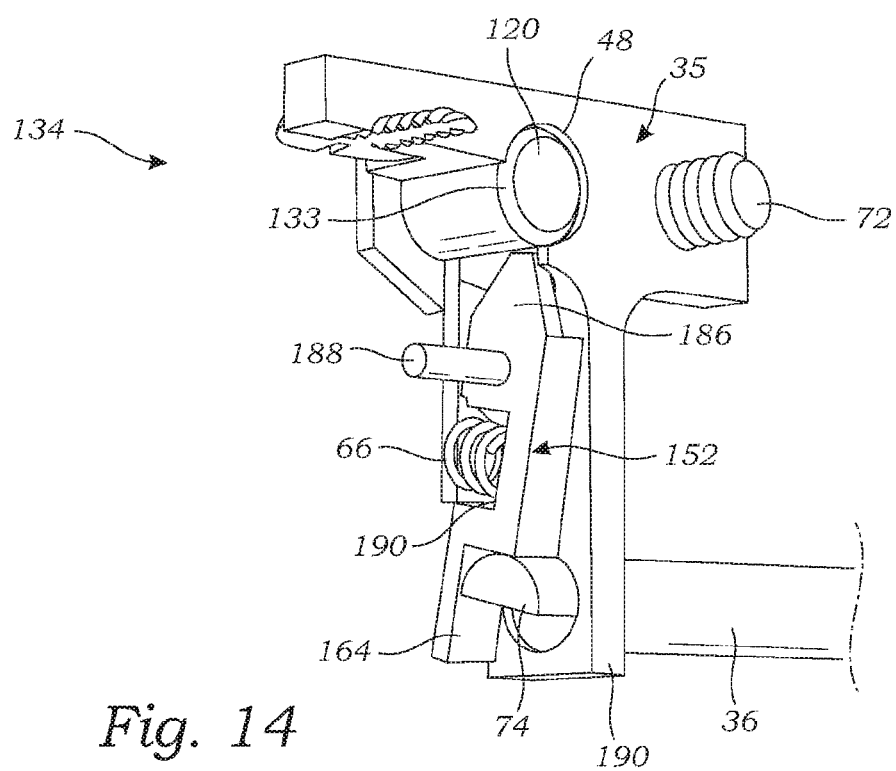
FIG. 14 is an enlarged, partial cutaway, perspective view of one of the mounting mechanisms of the mounting system of FIG. 11 showing the mounting mechanism in an unlocked position.
Figure 15:
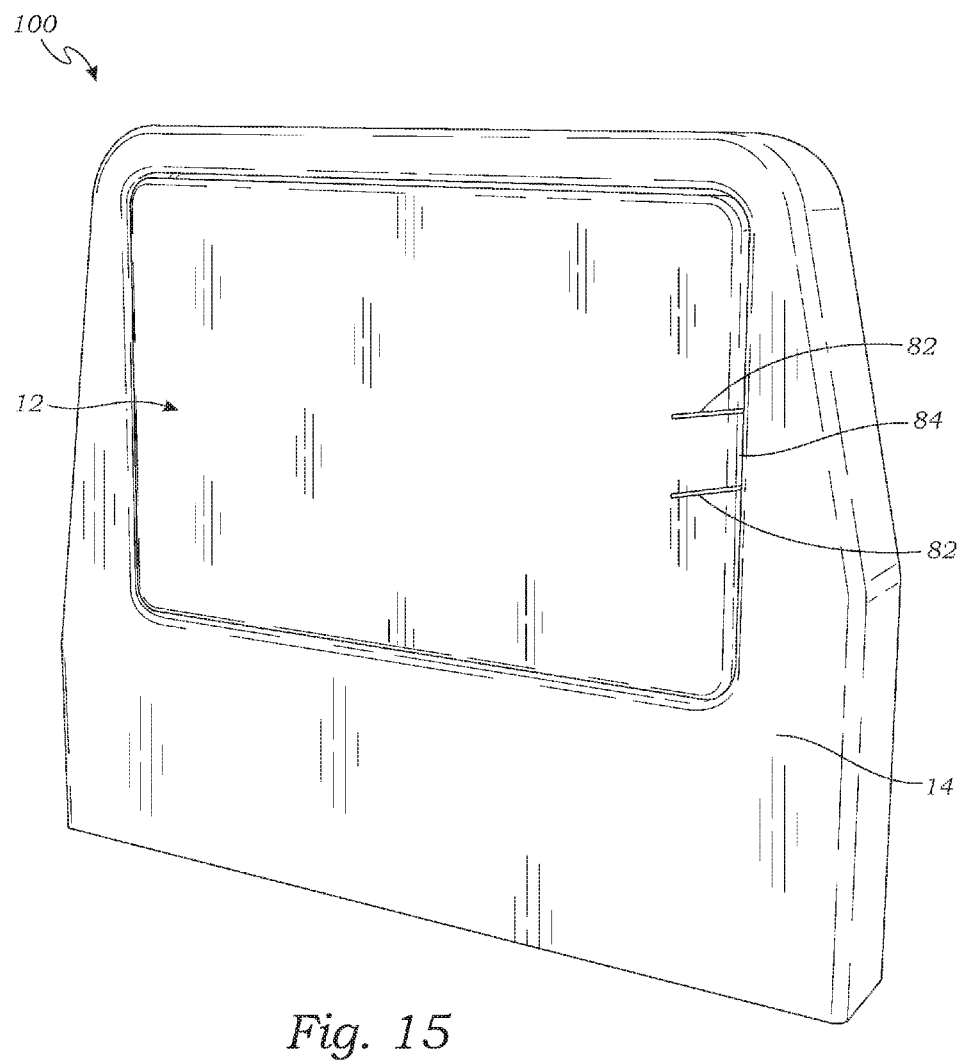
FIG. 15 is a front, perspective view of the mounting system of FIG. 11 showing the video monitor installed on the mounting surface using the mounting system.
Figure 16:
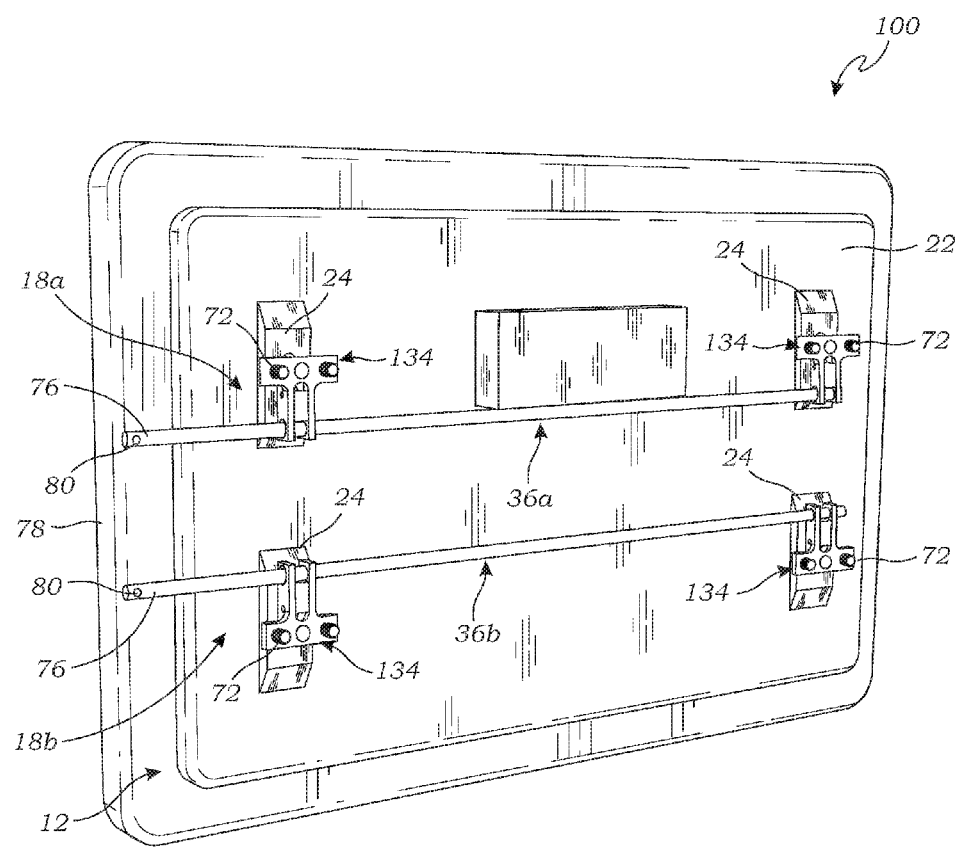
FIG. 16 is a rear, perspective view of the mounting system of FIG. 11 without the mounting surface shown in order to illustrate the video monitor installed onto the mounting system.

Turning to FIGS. 13 and 14, each mounting mechanism 134 has a main body 35, similar to the main body 35 of the mounting system 10. The main body 35 also has retainer hole 48 sized to receive the retaining stud 120, and accordingly has a diameter slightly larger than the head 32 of the retaining stud 20. The retaining stud 120 may be similar to the retaining stud 20 or it may be different in that the retainer stud 120 it is substantially cylindrical as shown in FIGS. 13 and 14 and does not include a mid-shaft 30 or head 32. The retaining stud 120 still has a lead-in tapered portion 133. The mounting mechanism 134 has a locking latch 152 rotatably coupled to the main body 35 using a pivot pin 188. The locking latch 152 is received in a slot in the main body 35 formed by two opposing arms 190 (only one of the arms 190 is shown in the partial cutaway views of FIGS. 13 and 14). The pivot pin 188 has a first end attached to one of the arms 190 and a second end attached to the opposing arm 190. The locking latch 152 has a hole through which the pivot pin 188 is inserted to rotatably couple the locking latch 152 to the main body 35. The locking latch 152 has a locking tip 186 at a first end of the locking latch 152 (positioned on one side of the pivot pin 188), a cam surface 164 at a second end (positioned on the other side of the pivot pin 188), and a spring surface 190 located between the first end and second end. The cam surface 164 may be formed by a notch in the second end of the locking latch 152. The locking latch 152 is rotatable (i.e., movable) between a locked position (as shown in FIG. 13) in which the locking tip engages the retaining stud 120 received in the retainer hole 48 which locks the retaining stud 120 within the retainer hole 48 and an unlocked position (as shown in FIG. 14) in which the locking tip is disengaged from the retaining stud 120 thereby allowing the retaining stud 120 to slide out of the retainer hole 48. The retaining stud 120 is roughened for increased frictional engagement with the locking tip in the locked position. The roughening may comprise conventional threads on the shaft of the retaining stud, ribs, or techniques to create an uneven surface.

The mounting mechanism 134 has a biasing spring 66 coupled to the spring surface 190 which biases the locking latch 152 toward the locked position. The cam shaft 36 has a cam 74 positioned adjacent the cam surface 164. The cam 74 is configured such that rotation of the cam shaft 36 in the first rotational direction causes the cam 74 to push the cam surface 164 thereby rotating the locking latch 152 to the unlocked position, and rotation of the cam shaft 36 in the second rotational direction causes the cam 74 to release the cam surface 164 thereby allowing the biasing spring 66 to rotate the locking latch 152 to the locked position.

The installation and operation of the mounting system 100 is substantially the same as that described above for the mounting system 10, except for the differences in the operation of the mounting mechanisms 134, described herein.

Although particular embodiments have been shown and described, it is to be understood that the above description is not intended to limit the scope of these embodiments. While embodiments and variations of the many aspects of the invention have been disclosed and described herein, such disclosure is provided for purposes of explanation and illustration only. Thus, various changes and modifications may be made without departing from the scope of the claims. For example, not all of the components described in the embodiments are necessary, and the invention may include any suitable combinations of the described components, and the general shapes and relative sizes of the components of the invention may be modified. While the mounting system 10 has been described for use with an LRU in the form of a video monitor 12, it could likewise be used for other types of LRUs for rapid attachment and detachment, such as seat electric boxes, floor distribution boxes, seat power modules, other types of LRUs. Accordingly, embodiments are intended to exemplify alternatives, modifications, and equivalents that may fall within the scope of the claims. The invention, therefore, should not be limited, except to the following claims, and their equivalents.

What is claimed is:

1. A mechanism for attaching a component to a supporting structure, comprising:
    a first mounting mechanism comprising;
        a first main body configured to be mounted to the supporting structure, the first main body having a first top surface configured to bear against the supporting structure and an opposing first bottom surface which faces the back surface of the component, the first main body having a first retainer hole extending from the first bottom surface and configured to receive a first retaining stud mounted to the back surface of the component, and a first cam shaft hole extending through a second side of the first main body;
        a first locking member coupled to the first main body, the first locking member configured to be movable from a locked position in which the first locking member engages the first retaining stud received in the first retainer hole thereby locking the first retaining stud to the first mounting mechanism and an unlocked position in which the first locking member is disengaged from the first retaining stud such that the first retaining stud can be removed from the first retainer hole;
        a first biasing spring coupled to the locking member and configured to bias the first locking member toward the locked position; and
    a cam shaft extending through the first cam shaft hole, the cam shaft having a first cam fixed in rotation with the cam shaft, the first cam coupled to the first locking member, wherein rotation of the cam shaft in a first rotational direction causes the first cam to move the first locking member toward the unlocked position, and rotation of the cam shaft in a second rotational direction opposite the first rotational direction causes the first cam to allow the first biasing spring to move the first locking member toward the locked position.

2. The mechanism of claim 1, further comprising:
a second mounting mechanism spaced apart from the first locking member, the second mounting mechanism comprising:
- a second main body configured to be mounted to the supporting structure, the second main body having a second top surface configured to bear against the supporting structure and an opposing second bottom surface which faces the back surface of the component, the second main body having a second retainer hole extending from the second bottom surface and configured to receive a second retaining stud mounted to the supporting structure, and a second cam shaft hole extending through a second side of the second main body;
- a second locking member coupled to the second main body, the second locking member configured to be movable from a locked position in which the second locking member engages the second retaining stud received in the second retainer hole thereby locking the second retaining stud to the second mounting mechanism and an unlocked position in which the second locking member is disengaged from the second retaining stud such that the second retaining stud can be removed from the second retainer hole;
- a second biasing spring coupled to the second locking member and configured to bias the second locking member toward the locked position; and
wherein the cam shaft extends through the second cam shaft hole, the cam shaft having a second cam fixed in rotation with the cam shaft, the second cam coupled to the second locking member, wherein rotation of the cam shaft in the first rotational direction causes the second cam to move the first locking member to the unlocked position, and rotation of the cam shaft in the second rotational causes the first cam to allow the second biasing spring to move the second locking member to the locked position.

3. The mechanism of claim 2, wherein:
the first main body further comprises a cylindrical first locking bolt hole extending along a longitudinal first axis from a first side of the first main body into the first main body;
the first retainer hole intersects the first locking bolt hole and extends substantially transverse to the first axis;
the first locking member comprises a first locking bolt slidably received in the locking bolt hole, the first locking bolt comprising a substantially cylindrical first shaft having a longitudinal first shaft axis, the first locking bolt having a conical first tip portion at a distal end of the first locking bolt, a first cylindrical portion at a proximal end of the first locking bolt and a first cam portion between the distal end and the proximal end of the first locking bolt, the first cam portion comprising a first notch in the first shaft which provides a first cam surface oriented substantially transverse to the first shaft axis, the first locking bolt configured to be slidable from the locked position in which the first tip portion is advanced into the first retainer hole such that the first tip portion engages the first retaining stud received in the first retainer hole and the unlocked position in which the first locking bolt is retracted from the first retainer hole such that the first locking bolt is disengaged from the first retaining stud received in the first retainer hole;
the first cam is disposed within the first notch such that rotation of the cam shaft in the first rotational direction causes the first cam to push the first cam surface thereby moving the first locking bolt to the unlocked position, and rotation of the cam shaft in the second rotational direction causes the first cam to release the first cam surface thereby allowing the first biasing spring to move the first locking bolt to the locked position;
the second main body further comprises a cylindrical second locking bolt hole extending along a longitudinal second axis from a first side of the second main body into the second main body;
the second retainer hole intersects the second locking bolt hole and extends substantially transverse to the second axis;
the second locking member comprises a second locking bolt slidably received in the locking bolt hole, the second locking bolt comprising a substantially cylindrical second shaft having a longitudinal second shaft axis, the second locking bolt having a conical second tip portion at a distal end of the second locking bolt, a second cylindrical portion at a proximal end of the second locking bolt and a second cam portion between the distal end and the proximal end of the second locking bolt, the second cam portion comprising a second notch in the second shaft which provides a second cam surface oriented substantially transverse to the second shaft axis, the second locking bolt configured to be slidable from the locked position in which the second tip portion is advanced into the second retainer hole such that the second tip portion engages the second retaining stud received in the second retainer hole and the unlocked position in which the second locking bolt is retracted from the second retainer hole such that the second locking bolt is disengaged from the second retaining stud received in the second retainer hole; and
the second cam is disposed within the second notch such that rotation of the cam shaft in the second rotational direction causes the second cam to push the second cam surface thereby moving the second locking bolt to the unlocked position, and rotation of the cam shaft in the second rotational direction causes the second cam to release the second cam surface thereby allowing the second biasing spring to move the second locking bolt to the locked position.

4. The mechanism of claim 3, wherein:
the cam shaft extends through at least one of the first main body or the second main body such that a first end of the cam shaft extends beyond the outer edge of the component when the component is mounted to the supporting structure using the mechanism, and the cam shaft further comprises a tool hole proximate the first end of the cam shaft and configured to receive a tool in the tool hole for rotating the cam shaft.

5. The mechanism of claim 4, wherein the tool hole is oriented at an angle relative to a longitudinal axis of the cam shaft.

6. The mechanism of claim 1, wherein:
the cam shaft extends through the first main body such that a first end of the cam shaft extends beyond the outer edge of the component when the component is mounted to the supporting structure using the mechanism, and the cam shaft further comprises a tool hole proximate the first end of the cam shaft configured to receive a tool in the tool hole for rotating the cam shaft.

7. The mechanism of claim 1, further comprising the component and the first retaining stud, wherein the first retaining stud is mounted to the back surface of the component and the first mounting mechanism is mounted to the supporting structure by attaching the first main body to the supporting structure with the first top surface bearing against the supporting structure.

8. The mechanism of claim 1, wherein the first main body comprises one or more mounting holes, and wherein the first mounting mechanism is mounted to the supporting structure by attaching the first main body to the supporting structure with the first top surface bearing against the supporting structure using fasteners inserted through the one or more mounting holes.

9. The mechanism of claim 1, wherein:
the first main body further comprises a cylindrical locking bolt hole extending along a longitudinal first axis from a first side of the first main body into the first main body;
the first retainer hole intersects the locking bolt hole and extends substantially transverse to the first axis;
the first locking member comprises a first locking bolt slidably received in the locking bolt hole, the first locking bolt comprising a substantially cylindrical first shaft having a longitudinal first shaft axis, the first locking bolt having a conical first tip portion at a distal end of the first locking bolt, a first cylindrical portion at a proximal end of the first locking bolt and a first cam portion between the distal end and the proximal end of the first locking bolt, the first cam portion comprising a first notch in the first shaft which provides a first cam surface oriented substantially transverse to the first shaft axis, the first locking bolt configured to be slidable from the locked position in which the first tip portion is advanced into the first retainer hole such that the first tip portion engages the first retaining stud received in the first retainer hole and the unlocked position in which the first locking bolt is retracted from the first retainer hole such that the first locking bolt is disengaged from the first retaining stud received in the first retainer hole; and
the first cam is disposed within the first notch such that rotation of the cam shaft in the first rotational direction causes the first cam to push the first cam surface thereby moving the first locking bolt to the unlocked position, and rotation of the cam shaft in the second rotational direction causes the first cam to release the first cam surface thereby allowing the first biasing spring to move the first locking bolt to the locked position.

10. The mechanism of claim 1, wherein:
the first locking member comprises a locking latch rotatably coupled to the first main body and rotatable about a pivot axis, the locking latch having a locking tip at a first end of the locking latch, and a cam surface at a second end of the locking latch, the first locking member configured to be rotatable from the locked position in which the locking tip engages the first retaining stud received in the first retainer hole thereby locking the first retaining stud to the first mounting mechanism and the unlocked position in which the locking tip is disengaged from the first retaining stud received in the first retainer hole; and
the first cam is positioned adjacent the cam surface such that rotation of the cam shaft in the first rotational direction causes the first cam to rotate the locking latch to the unlocked position, and rotation of the cam shaft in the second rotational direction causes the first cam to release the cam surface thereby allowing the biasing spring to rotate the locking latch to the locked position.

11. The mechanism of claim 10, wherein the cam shaft extends through the first main body such that a first end of the cam shaft extends beyond the outer edge of the component when the component is mounted to the supporting structure using the mechanism, and the cam shaft further comprises a tool hole proximate the first end of the cam shaft configured to receive a tool in the tool hole for rotating the cam shaft.

12. A mounting system for mounting a component to a supporting structure, the component having a back surface and an outer edge defining the perimeter of the component, comprising:
a first mounting assembly comprising:
a first mounting mechanism comprising:
a first main body configured to be mounted to the supporting structure, the first main body having a first retainer hole configured to receive a first retaining stud mounted to the back surface of the component, and a first cam shaft hole;
a first locking member coupled to the first main body, the first locking member configured to be movable from a locked position in which the first locking member engages the first retaining stud received in the first retainer hole thereby locking the first retaining stud to the first mounting mechanism and an unlocked position in which the first locking member is disengaged from the first retaining stud such that the first retaining stud can be removed from the first retainer hole;
a first biasing spring coupled to the first locking member and configured to bias the first locking member toward the locked position;
a second mounting mechanism comprising:
a second main body configured to be mounted to the supporting structure, the second main body having a second retainer hole configured to receive a second retaining stud mounted to the back surface of the component, and a second cam shaft hole;
a second locking member coupled to the second main body, the second locking member configured to be moveable from a locked position in which the second locking member engages the second retaining stud received in the second retainer hole thereby locking the second retaining stud to the second mounting mechanism and an unlocked position in which the second locking member is disengaged from the second retaining stud such that the second retaining stud can be removed from the second retainer hole;
a second biasing spring coupled to the second locking member and configured to bias the second locking member toward the locked position; and
a cam shaft extending through the first cam shaft hole and the second cam shaft hole, the cam shaft having a first cam and a second cam each fixed in rotation with the cam shaft, the first cam coupled to the first locking member, the second cam coupled to the second locking member, wherein rotation of the cam shaft in a first rotational direction causes the first cam to move the first locking member to the unlocked position and also causes the second cam to move the second locking member to the unlocked position, and rotation of the cam shaft in a second rotational direction opposite the first rotational direction causes the first cam thereby allowing the first biasing spring to move the first locking member to the locked position and also causes the second cam thereby allowing the second biasing spring to move the second locking member to the locked position.

13. The mounting system of claim 12, wherein:
the cam shaft extends through at least one of the first main body or the second main body and beyond the outer edge of the component when the component is mounted to the supporting structure using the mounting system such that a first end of the cam shaft extends beyond the outer edge of the component, and the cam shaft further comprises a tool hole proximate the first end of the cam shaft configured to receive a tool in the tool hole for rotating the cam shaft.

14. The mounting system of claim 13, wherein the tool hole is oriented at an angle relative to a longitudinal axis of the cam shaft.

15. The mounting system of claim 12, further comprising the component, the first retaining stud and the second retaining stud, wherein the first mounting mechanism is mounted to the supporting structure by attaching the first main body to the back surface and the second mounting mechanism is mounted to the supporting structure by attaching the second main body to the supporting structure.

16. The mounting system of claim 15, further comprising a second mounting assembly having the same configuration as the first mounting assembly, wherein the second mounting assembly is mounted to the supporting structure and arranged parallel to the first mounting assembly such that a cam shaft of the second mounting assembly is parallel to the first cam shaft.

17. The mounting system of claim 12, wherein the first main body comprises one or more mounting holes and the second main body comprises one or more mounting holes, and the mounting system further comprises the component, the first retaining stud and the second retaining stud, wherein the first mounting mechanism is mounted to the supporting structure by attaching the first main body to the supporting structure using fasteners inserted through the one or more mounting holes of the first main body, and the second mounting mechanism is mounted to the supporting structure by attaching the second main body to the mounting using fasteners inserted through the one or more mounting holes of the second main body.

18. A component for being mounted to a supporting structure using a mounting mechanism attached to the supporting structure and configured to releasably connect to the component, the component comprising:
a component comprising a housing substantially enclosing parts of the component, the housing having a back surface; and
a plurality of retaining studs attached to the back surface and extending outward from the back surface, each retaining stud having a shaft for attaching to the back surface, a mid-shaft having a first end extending from the threaded shaft and a head having a first side attached to a second end of the mid-shaft and a second side having a conical, tapered portion, the mid-shaft having a smaller diameter than the head, the retaining studs configured to be received in the mounting mechanism such that the retaining studs can be releasably locked to the mounting mechanism.

19. The component of claim 18, wherein the component comprises one of a line replaceable unit, a video monitor, a seat electric box, a floor distribution box, a seat power module, and a panel mounted instrument.

20. The component of claim 18, wherein the conical, tapered portion is configured to interface with the locking member such that insertion of the retaining stud into the mounting mechanism causes the locking member to move to an unlocked position thereby allowing the retaining stud to be inserted into the mounting mechanism.

21. A mounting mechanism comprising;
a main body including a top surface and an opposing bottom surface, the main body having a retainer hole extending from the bottom surface and configured to receive the retaining stud, the main body including a side and a cam shaft hole extending through said side;
a locking member coupled to the main body, the locking member configured to be movable from a locked position in which the first locking member engages the retaining stud when received in the first retainer hole thereby locking the retaining stud therein and an unlocked position in which the locking member is disengaged from the first retaining stud such that the first retaining stud can be removed from the retainer hole;
a biasing spring coupled to the locking member and configured to bias the locking member toward the locked position; and
a cam shaft extending through the cam shaft hole, the cam shaft having a cam fixed in rotation with the cam shaft, the cam coupled to the locking member, wherein rotation of the cam shaft in a first rotational direction causes the cam to move the locking member toward the unlocked position, and rotation of the cam shaft in a second rotational direction opposite the first rotational direction causes the cam to allow the biasing spring to move the locking member toward the locked position.

* * * * *